(12) United States Patent
Nagase et al.

(10) Patent No.: US 9,713,262 B2
(45) Date of Patent: Jul. 18, 2017

(54) VIA ADDING METHOD

(71) Applicant: FUJITSU LIMITED, Kawasaki-shi, Kanagawa (JP)

(72) Inventors: Kenji Nagase, Yokohama (JP); Yoshiaki Hiratsuka, Ota (JP); Tomoyuki Nakao, Yokohama (JP); Yoshihiro Sawada, Inagi (JP); Keisuke Nakamura, Tachikawa (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/855,786

(22) Filed: Sep. 16, 2015

(65) Prior Publication Data

US 2016/0007471 A1   Jan. 7, 2016

Related U.S. Application Data

(62) Division of application No. 14/077,562, filed on Nov. 12, 2013, now Pat. No. 9,173,295.

(30) Foreign Application Priority Data

Mar. 21, 2013   (JP) .................................. 2013-058634

(51) Int. Cl.
  *H05K 1/11*   (2006.01)
  *H05K 3/00*   (2006.01)
  *G06F 17/50*  (2006.01)

(52) U.S. Cl.
  CPC ....... *H05K 3/0005* (2013.01); *G06F 17/5072* (2013.01); *H05K 1/115* (2013.01)

(58) Field of Classification Search
  CPC ............ H05K 3/05; H05K 3/12; B41F 15/08; B41F 15/14; G06F 17/50; G06F 17/5068; G01R 31/28
  USPC ................. 174/266, 262; 716/118, 125, 137; 101/123, 129; 324/763.01
  See application file for complete search history.

(56) References Cited

U.S. PATENT DOCUMENTS 5,995,884 A * 11/1999 Allen .................. G05D 1/0225
                                                  180/167
6,640,002 B1    10/2003 Kawada
(Continued)

FOREIGN PATENT DOCUMENTS

JP          4-566       1/1992
JP       2009-99139     5/2009
(Continued)

OTHER PUBLICATIONS

Restriction Requirement dated Mar. 26, 2015 from U.S. Appl. No. 14/077,562.
(Continued)

*Primary Examiner* — Xiaoliang Chen
(74) *Attorney, Agent, or Firm* — Staas & Halsey LLP (57) ABSTRACT

A via adding method comprising: identifying a target area where a via is to be added in a printed circuit board; determining a starting point for starting a search for a location of the via in the target area; and moving a search point along a path in an intersecting direction that intersects a radial direction around the starting point while moving the search point in the radial direction and determining whether the via is to be added at a moved search point.

6 Claims, 9 Drawing Sheets

(56) References Cited

U.S. PATENT DOCUMENTS

| | | | | |
|---|---|---|---|---|
| 7,619,434 B1* | 11/2009 | Lorenz | ............... | G01R 31/2818 324/763.01 |
| 2001/0032556 A1* | 10/2001 | Ishida | ................. | B41F 15/0818 101/129 |
| 2009/0083687 A1* | 3/2009 | Sadamatsu | .......... | G06F 17/5068 716/137 |
| 2010/0011326 A1* | 1/2010 | Sadamatsu | .......... | G06F 17/5068 716/125 |
| 2013/0044825 A1* | 2/2013 | Jalowiecki | ........... | H04N 19/176 375/240.26 |

FOREIGN PATENT DOCUMENTS

| | | |
|---|---|---|
| JP | 2010-20644 | 1/2010 |
| JP | 2012-53726 | 3/2012 |

OTHER PUBLICATIONS

Office Action dated Apr. 21, 2015 from U.S. Appl. No. 14/077,562.
Notice of Allowance dated Jul. 29, 2015 from U.S. Appl. No. 14/077,562.
U.S. Appl. No. 14/077,562, filed Nov. 12, 2013, Kenji Nagase, Fujitsu Limited.
Japanese Office Action mailed Oct. 4, 2016 in related Japanese Application No. 2013-058634.

* cited by examiner

VIA ADDING METHOD

CROSS-REFERENCE TO RELATED APPLICATION

This application is a divisional of U.S. patent application Ser. No. 14/077,562, filed on Nov. 12, 2013, which is currently pending, and claims the benefit of priority of the prior Japanese Patent Application No. 2013-058634, filed on Mar. 21, 2013, the entire contents of which are incorporated herein by reference.

FIELD

Embodiments discussed herein are related to a technique for producing a via.

BACKGROUND

Complication of the structure of a printed circuit board (PCB) increases the design time. The printed circuited board is a source of generating electromagnetic interference (EMI) affecting other electronic devices or human bodies. To address this, electromagnetic compatibility (EMC) requirements are demanded for designing the printed circuit board, thus resulting in the increased design time.

Related techniques are disclosed in Japanese Laid-open Patent Publication Nos. 2010-20644, 2012-53726, and 2009-99139.

SUMMARY

According to an aspect of the embodiments, a design support apparatus includes: an area identifying unit configured to identify a target area where a via is to be added in a printed circuit board; a determining unit configured to determine a starting point for starting a search for a location of the via in the target area; and a searching unit configured to move a search point along a path in an intersecting direction that intersects a radial direction around the starting point while moving the search point in the radial direction and to determine whether the via is to be added at a moved search point.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

To reduce EMI, vias for electrically coupling a plurality of layers in a printed circuit board are added. The vias for reducing EMI are placed away from wiring through which signals pass, components, and a region used for mounting the components. The number of vias placed is large, and determining placement of vias to be added by human power may take long time. Therefore, a design support apparatus for supporting design of a printed circuit board automatically determines placement of vias.

The design support apparatus identifies an area where vias are to be placed and determines a location of each of the vias is to be placed in the identified area. For example, a location, by a predetermined distance, away from a reference via whose placement has been determined is calculated in each of four directions of up, down, left, and right from the reference via, it is determined whether the via is to be placed in each of the calculated locations, and the location where the via is to be placed is determined. The via whose placement has been determined may be a new reference via. The via may be first placed along the border of the identified area.

In another design support apparatus, a grid having a set spacing between lines is estimated, a tentative via is placed in each of the points of intersections of lines, and the location of a via to be actually placed is determined among the placed tentative vias. To avoid redundantly placing vias, undesired tentatively placed vias are removed.

In the above-described design support apparatus, there is a location on which a plurality of determinations whether a via is to be placed are performed, and determining the location of the via to be placed takes long time.

Figure 1:
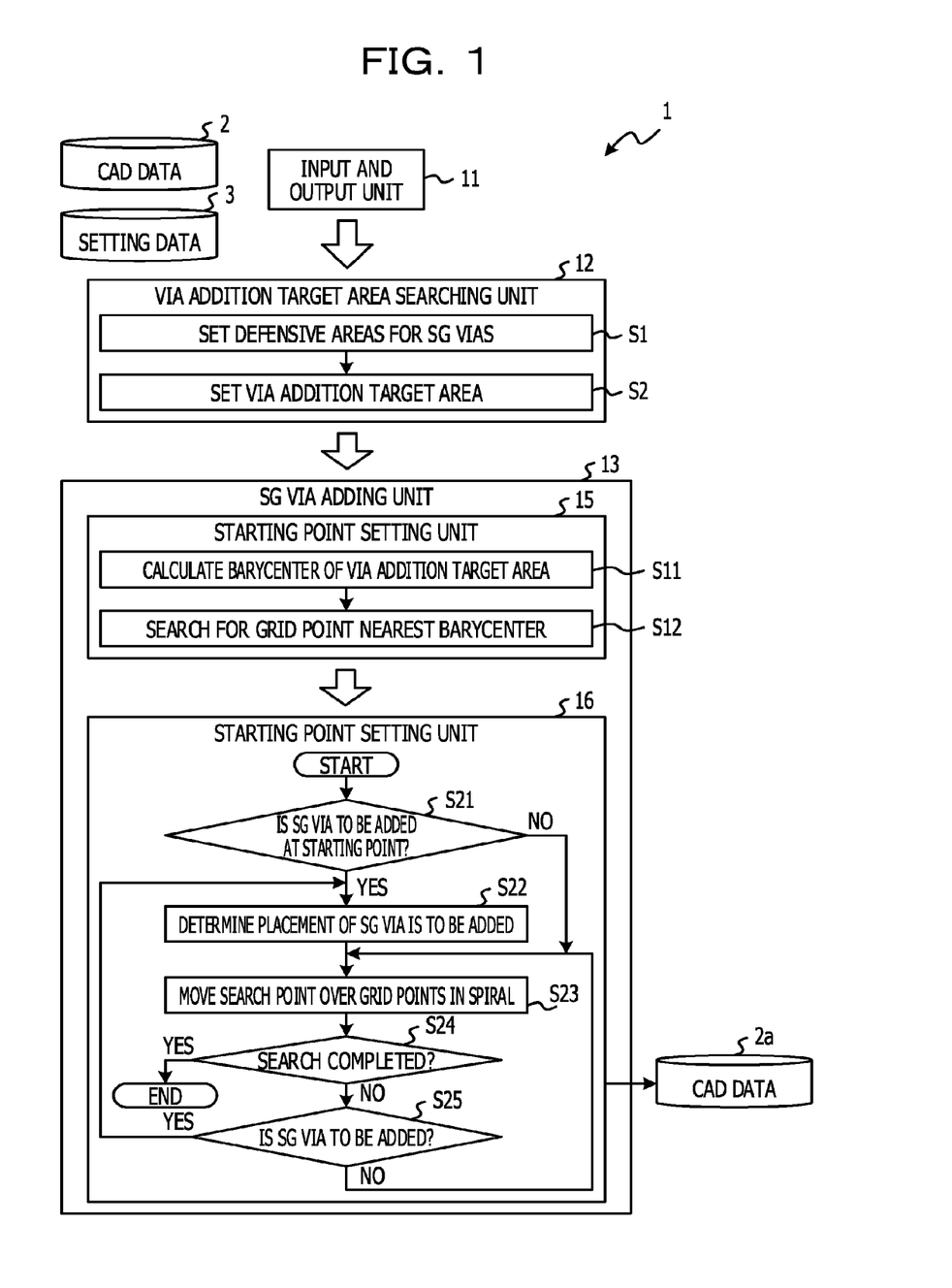
FIG. 1 illustrates an example of a design support apparatus.

FIG. 1 illustrates an example of a design support apparatus.

A design support apparatus 1 supports designing by determining placement of a via to be added in a designed printed circuit board to reduce EMI. The design support apparatus 1 illustrated in FIG. 1 includes an input and output unit 11, a via addition target area searching unit 12, and an SG via adding unit 13. In FIG. 1, the via addition target area searching unit 12 and the SG via adding unit 13 and their processing are illustrated.

The input and output unit 11 receives and outputs various kinds of data and receives an instruction from a designer. To determine placement of an SG via to be added to suppress EMI, the input and output unit 11 receives computer aided design (CAD) data 2 representing a designed printed circuit board and setting data 3. A "via" indicates an SG via to be added unless otherwise specified.

The setting data 3 may be data for use in determining placement of vias. To reduce EMI, the vias are placed at or within a certain interval. The setting data 3 may be used in determining the certain interval.

For example, a printed circuit board having a multilayer structure may include two or more ground layers. In such a printed circuit board having two or more ground layers, EMI may be large if the interval between the vias is equal to or larger than $1/20$ of the wavelength of an estimated signal. Thus the certain interval may be equal to or smaller than an interval determined in consideration of a parameter of the estimated signal wavelength $\lambda$. For example, the certain interval may be equal to or smaller than 1/20 of the estimate signal wavelength λ. The determined certain interval may be referred to as "defensive area length." The defensive area length may be a maximum interval allowable as the interval between the vias.

The range for regulating EMI may have a higher frequency of 6 GHz. When a signal with a frequency of 6 GHz is estimated, if the relative permittivity of an inner layer of the printed circuit board is 4.7, the signal wavelength λ can be represented as follows:

$$\lambda = 3.0 \times 10^8 / 6.0 \times 10^9 \times (1/4.7)^{1/2} \approx 0.023[m] \quad (1)$$

When the certain interval is 1/20 of the signal wavelength λ, as described above, it may be assumed that an added via appropriately suppresses EMI in a range of a circle with a radius of λ/40 from the location of the via. This circle may be referred to as "defensive area." A circle 22 illustrated in FIG. 4 may be one example of the defensive area.

The setting data 3 contains data for determining the above-described defensive area length. For example, the setting data 3 may contain data directly indicating the defensive area length or data for calculating the defensive area length. The defensive area length may be determined using other methods.

The via addition target area searching unit 12 determines the defensive area length using the CAD data 2 and the setting data 3 input from the input and output unit 11 (S1) and identifies a via addition target area where vias are to be added (S2).

Figure 2:
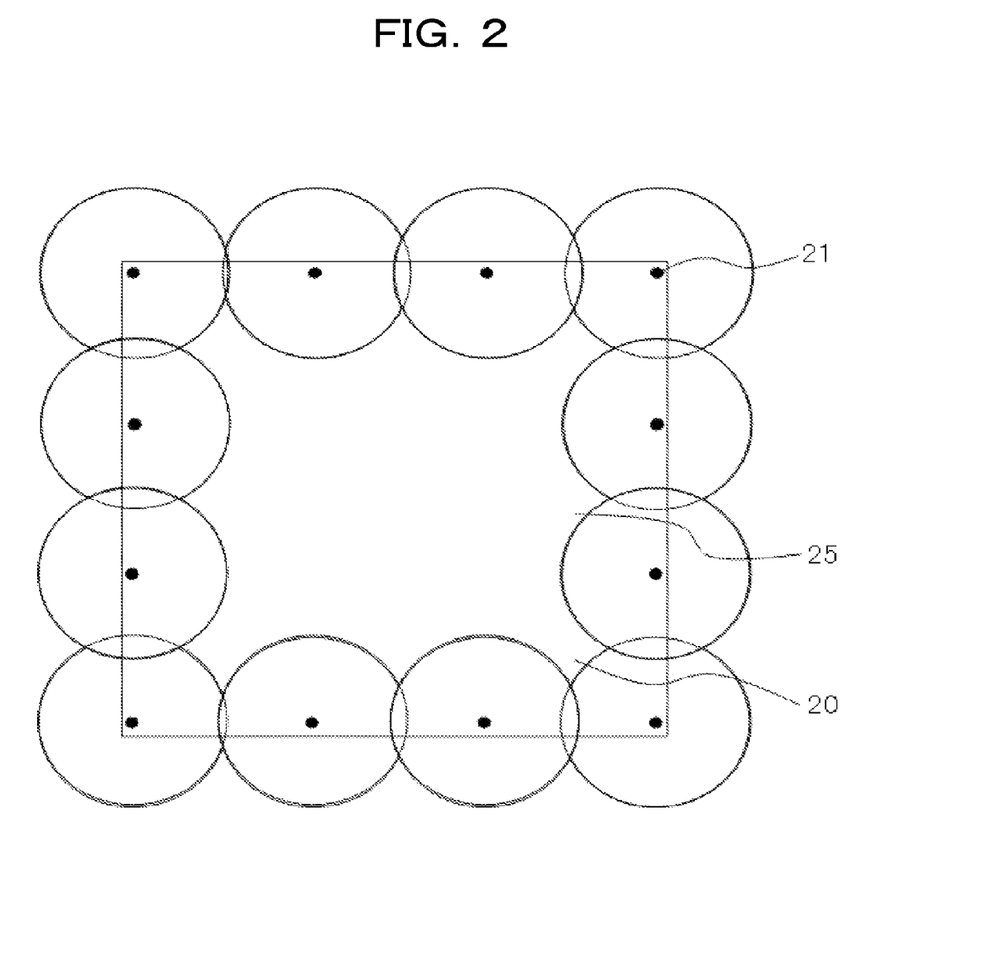
FIG. 2 illustrates an example of a target area for addition.

FIG. 2 illustrates an example of an addition target area. Added vias couple a layer in which signal wiring is placed (hereinafter referred to as "signal layer") and at least one of the ground layers. For example, the vias are described as "signal ground (SG) vias" at S1 in FIG. 1. Thus the area where vias are to be added is an area where vias can be placed in the signal layer and is an area where the ground plane is present in the ground layer. A rectangle 20 illustrated in FIG. 2 may be an entire area where vias are to be added and where the target area in the signal layer and the target area in the ground layer overlap each other (hereinafter may be expressed as "entire target area").

For example, as illustrated in FIG. 2, vias 21 are placed at intervals equal to or smaller than the defensive area length along the border of the entire target area 20. Thus a via addition target area 25 may be a portion in which a defensive area 22 for each of the vias 21 is removed from the entire target area 20. The vias 21 may be placed along the border of the entire target area 20 because there is little obstacles to placing the vias 21 and impedance is efficiently reduced in the vicinity of the border. The entire target area 20 may also be considered to be the via addition target area 25. To distinguish from the vias 21 placed along the border of the entire target area 20, a reference numeral 51 is used in a via placed within the via addition target area 25.

The SG via adding unit 13 may add a via within the via addition target area 25 and includes a starting point setting unit 15 and a grid searching unit 16. The SG via adding unit 13 receives the CAD data 2, the defensive area length, a result of search on the via addition target area 25, or other data from the via addition target area searching unit 12.

For example, the locations of vias to be added may be sequentially determined by moving a search point within the via addition target area 25 and checking whether a via is to be added at the search point. The starting point may be an initial location of the search point, for example, an origin. The starting point setting unit 15 sets the starting point for each via addition target area 25.

Figure 3:
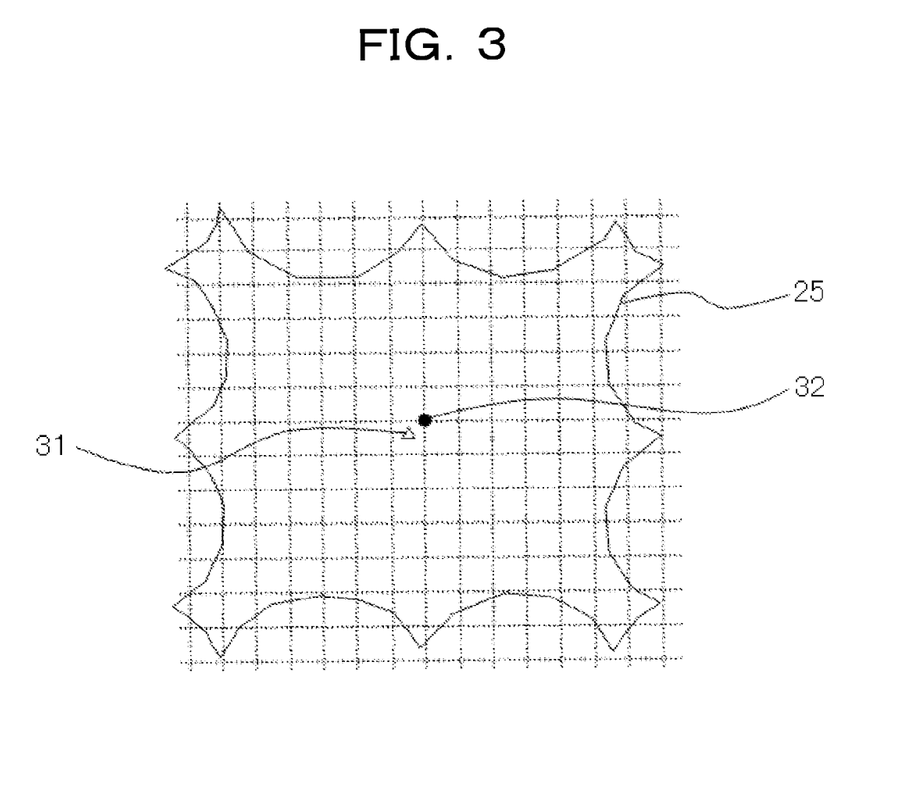
FIG. 3 illustrates an example of setting a starting point.

FIG. 3 illustrates an example of setting a starting point. In FIG. 3, a reference numeral 31 indicates the barycenter of the via addition target area 25, and a reference numeral 32 indicates the set starting point. The vertical and horizontal dotted lines indicate a grid set as the wiring resource in a printed circuit board.

The starting point setting unit 15 finds the barycenter 31 of the via addition target area 25 (S11). The starting point setting unit 15 illustrated in FIG. 1 searches for the grid point nearest the barycenter 31 from among the grind points being the intersections of the dotted lines illustrated in FIG. 3 and sets the grid point retrieved in the search at the starting point 32 (S12). The result of setting the starting point 32 is output to the grid searching unit 16.

Figure 4:
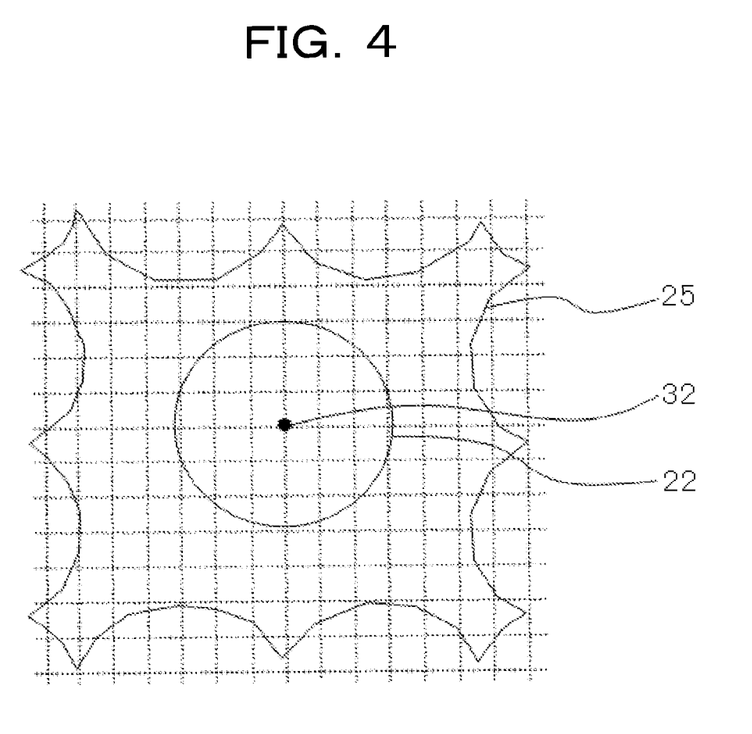
FIG. 4 illustrates an example of placement of a via to be added.

The grid searching unit 16 determines the location of a via to be added by checking whether the via is to be placed at the search point while moving the search point from the starting point 32 as its initial location. Because the starting point 32 is the initial location of the search point, whether the via is to be placed is checked at the starting point 32. FIG. 4 illustrates an example of placement of a via to be added. When the via addition target area 25 and the defensive areas 22 illustrated in FIG. 2 are present, the starting point 32 may be determined as the location of the via to be placed, as illustrated in FIG. 4. To distinguish from the other vias 51 to be placed within the via addition target area 25, the reference numeral 32 is used in the via placed at the starting point 32. FIG. 4 illustrates the via whose placement is initially determined at the beginning of searching for placement of vias to be added.

Figure 5A:
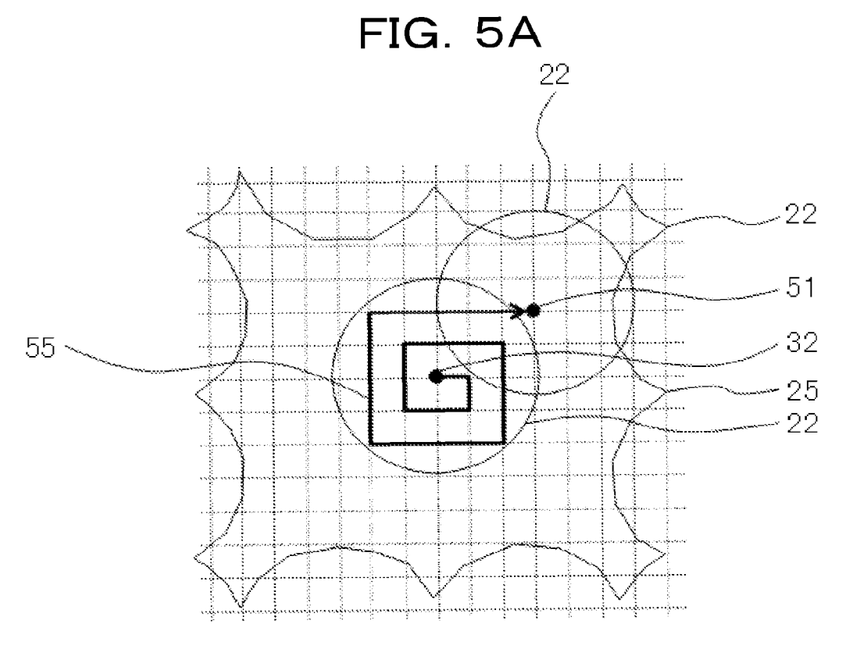
FIG. 5A illustrates an example of a path of travel of a search point.

FIG. 5A illustrates an example of a path of travel of a search point.

As illustrated in FIG. 5A, the grid searching unit 16 moves the search point along the grid. The search point is moved along the grid while the grid point used as the origin is continuously changed in a radial direction around the starting point 32. The path from the origin in the radial direction may have a rectangular shape having the same grid number. The grid number used herein is the number of the lines of the grid from the starting point 32 to the origin. The location of the origin in the radial direction moves in a direction further away from the starting point 32. Thus a path 55 of travel of the search point may be spiral (helical), as illustrated in FIG. 5A. The term "spiral" used in this specification indicates any shapes relating to a spiral, including a rectangular spiral.

In the determination whether the via 51 is to be placed, it is determined whether the grid point that is the search point is outside the defensive area 22, as illustrated in FIG. 5A. Thus in FIG. 5A, the via 51 may be placed at the time when the search point is moved to a grid point outside the defensive area 22 for the via 32.

Figure 5B:
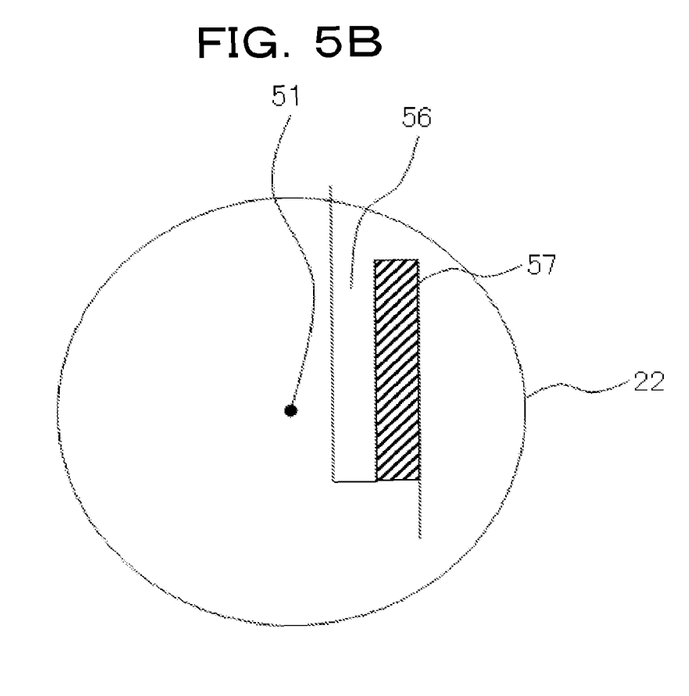
FIG. 5B illustrates another example of determination of placement of a via.

FIG. 5B illustrates another example of determination of placement of a via. As illustrated in FIG. 5B, when a portion 57 divided by a slit 56 is present in the via addition target area 25, the via 51 is placed even if the portion 57 is within the defensive area 22 for another via 51. The shape of the via addition target area 25 may also be considered in determining whether the via 51 is to be placed.

Figure 6:
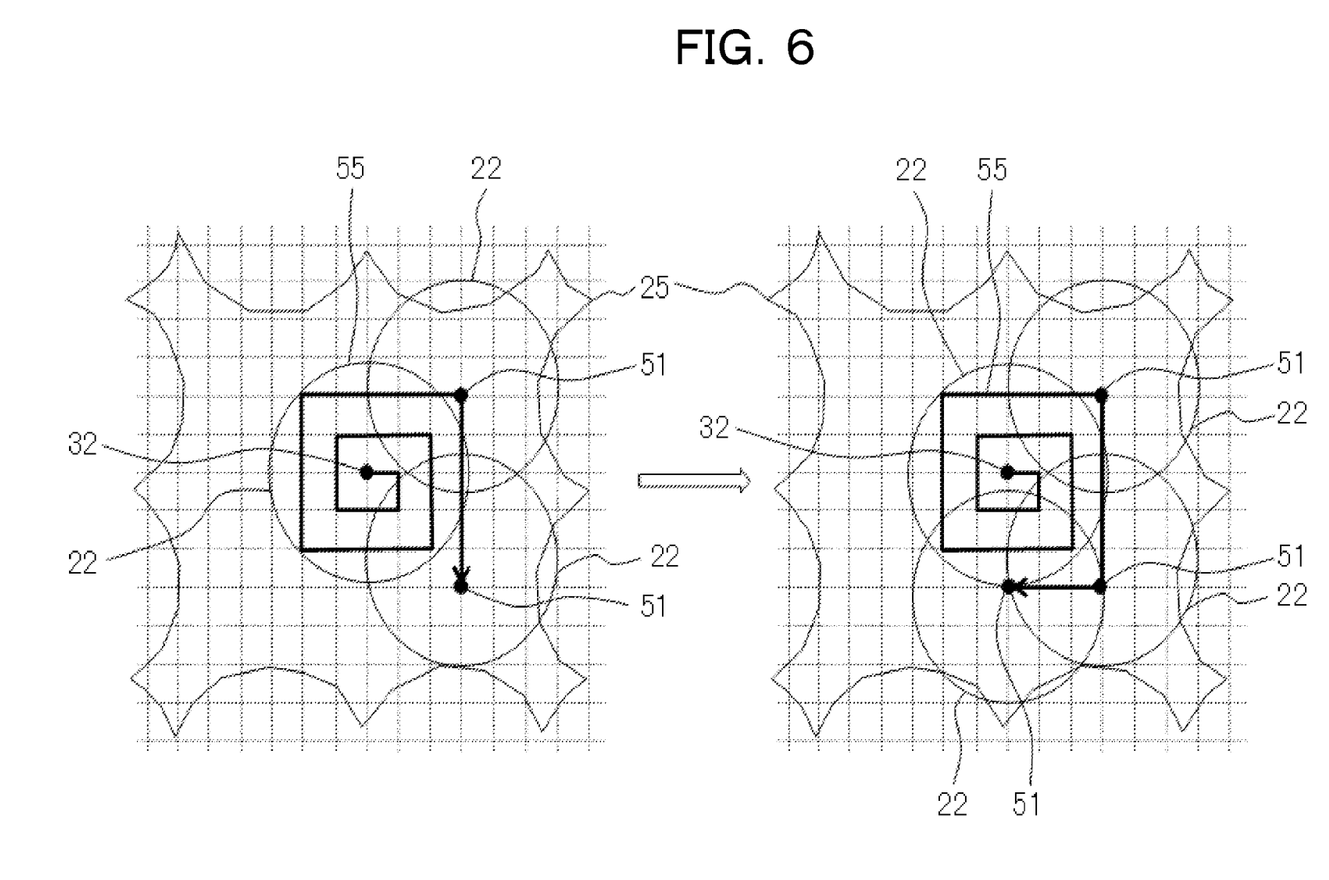
FIG. 6 illustrates an example of placement of vias.

FIG. 6 illustrates an example of placement of vias. FIG. 6 illustrates vias sequentially placed after the state illustrated in FIG. 5A. The grid searching unit 16 continues to determine the location where another via 51 is to be placed while moving the search point after determining that the via 51 is to be placed in the location illustrated in FIG. 5A. As a result, placement of two more vias 51 is determined.

Figure 7:
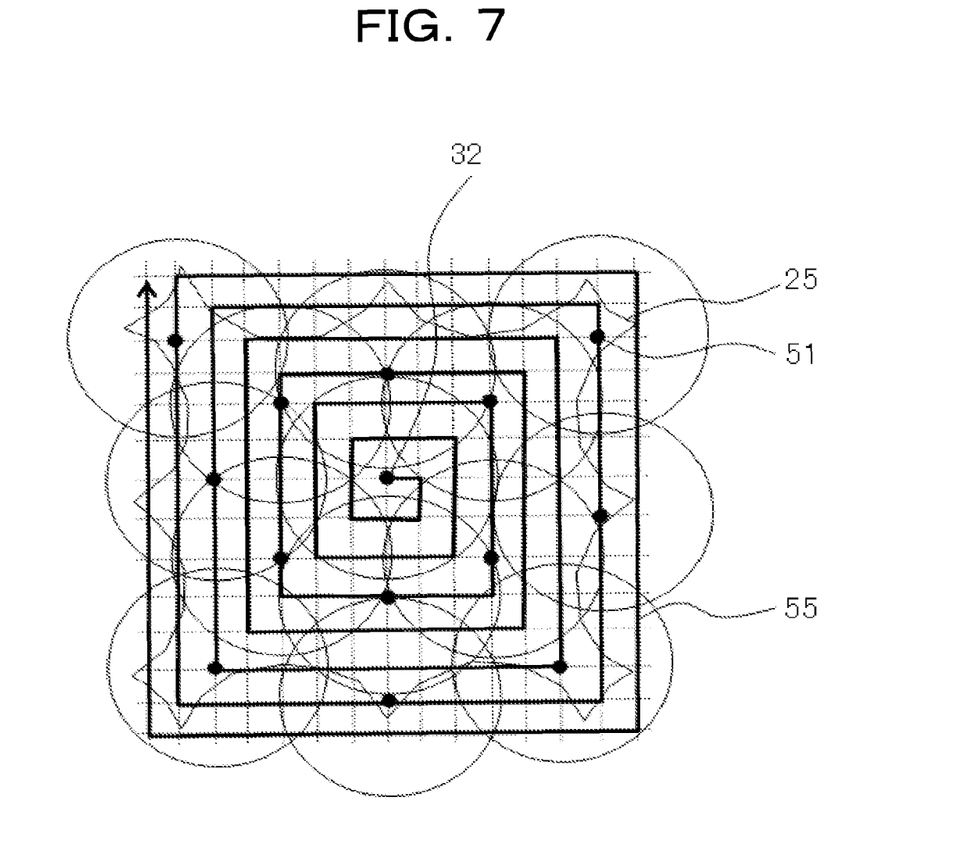
FIG. 7 illustrates another example of a path of travel of a search point.
Figure 8:
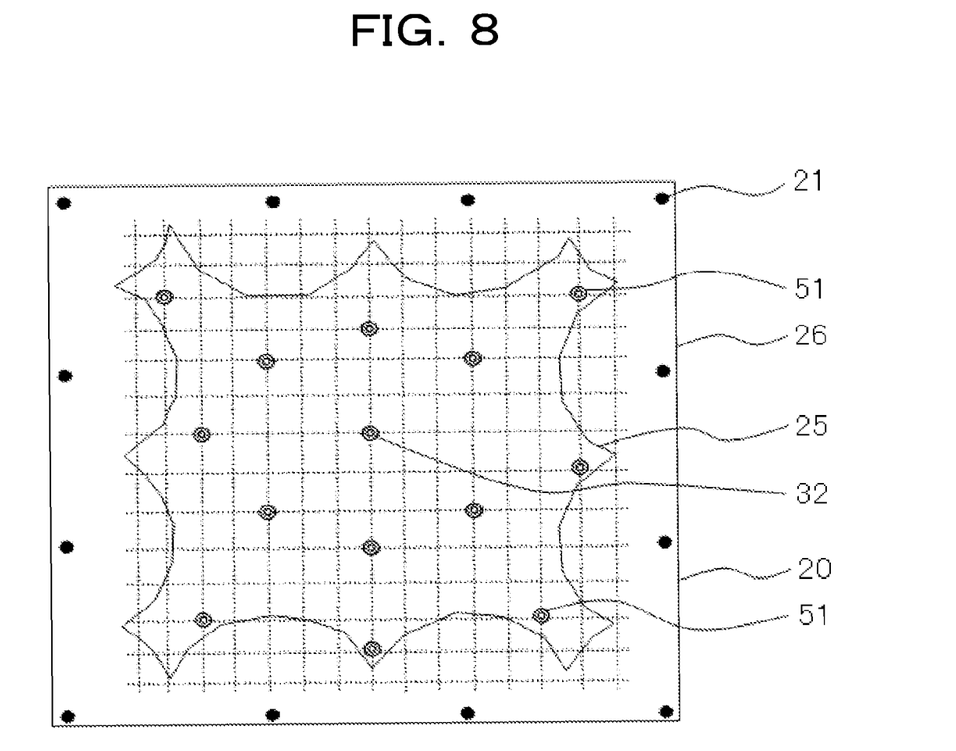
FIG. 8 illustrates another example of locations of vias to be placed.

The search point is moved along the grid to a neighboring grid point. The movement of the search point ends when there are no grind points to which the search point can be moved within the via addition target area 25. FIG. 7 illustrates another example of a path of travel of the search point. FIG. 7 illustrates the travel path at the time when the movement of the search point ends and the location of each of the vias whose placement is determined on the travel path. FIG. 8 illustrates another example of locations of the vias to be placed. FIG. 8 illustrates the location of each of the vias whose placement is determined within the entire target area including the via addition target area.

When the via 51 is placed while the search point is moved from the starting point 32 in a spiral, the grid points for use in checking whether the via 51 is to be placed may not overlap one another. The search point may be moved easily. The vias each having the defensive area 22 for use in consideration for determination whether the via 51 is to be placed are limited, and thus a load of processing for determining whether the via 51 is to be placed may be reduced. One example reason is that in a region outside the origin in the radial direction corresponding to the search point as viewed from the starting point 32, the vias 21 placed along the border of the entire target area 20 are used in the consideration.

The placement of each of the vias 21, 32, and 51 to be added in the entire target area 20 including the via addition target area 25 may be promptly determined. The vias 51 are placed in appropriate locations, and thus redundant addition of the vias 51 may be avoided or reduced. The cost of manufacturing the printed circuit board may also be reduced.

As illustrated in FIGS. 7 and 8, when the starting point 32 is set in the vicinity of the barycenter 31, the added vias 51 are evenly spaced. The density of the vias 51 may not vary depending on the site.

When vias are placed on grid points of an estimated rectangular grid, the maximum number of other near vias in the radial direction around a via may be six. For example, when the vias 51 are placed while the search point is moved from the starting point 32 in a spiral, the number of other vias 51 near the via 32 at the starting point 32 in the radial direction may be seven, as illustrated in FIG. 8. That number may be eight or more depending on the path of travel of the search point.

The vias 32 and 51 illustrated in FIGS. 4 to 7 may be placed by the process illustrated in FIG. 1. In FIG. 1, the process is performed on the single via addition target area 25.

The grid searching unit 16 sets the set starting point 32 at the initial location of the search point and determines whether the via 32 is to be added in the starting point 32 (S21). When the starting point 32 is not within any of the defensive areas 22 for the vias 21, the determination at S21 is YES and the process proceeds to S22. When the starting point 32 is within any of the defensive areas 22 for the vias 21, the determination at S21 is NO and the process proceeds to S23.

At S22, the grid searching unit 16 determines that the current location of the search point is the location of the via 32 or 51 to be added. The grid searching unit 16 moves the search point along the grid in a spiral (S23). The grid searching unit 16 determines whether the search has been completed (S24). When the moved search point is outside the via addition target area 25 and there are no grid points to which the search point has not yet been moved within the via addition target area 25, the determination at S24 is YES and the process for the single via addition target area 25 has ended. When the moved search point is within the via addition target area 25 or there is a grid point to which the search point has not yet been moved within the via addition target area 25, the determination at S24 is NO and the process proceeds to S25.

At S25, the grid searching unit 16 determines whether the via 51 is to be added in the current location of the search point (grid point). For example, as illustrated in FIG. 5B, at least one via 51 may be added in the portion 57, which is unlikely to be affected by the defensive area 22 due to the slit 56 or the like. In the portion affected by the defensive area 22, the via 51 is added outside the defensive area 22, as illustrated in FIG. 5A. Thus in neither of the two cases described above, the determination at S25 is YES, the process returns to S22, and the single via 51 is added. In either one of the two cases described above, the determination at S25 is NO, the process returns to S23, and the search point is moved.

Figure 9:
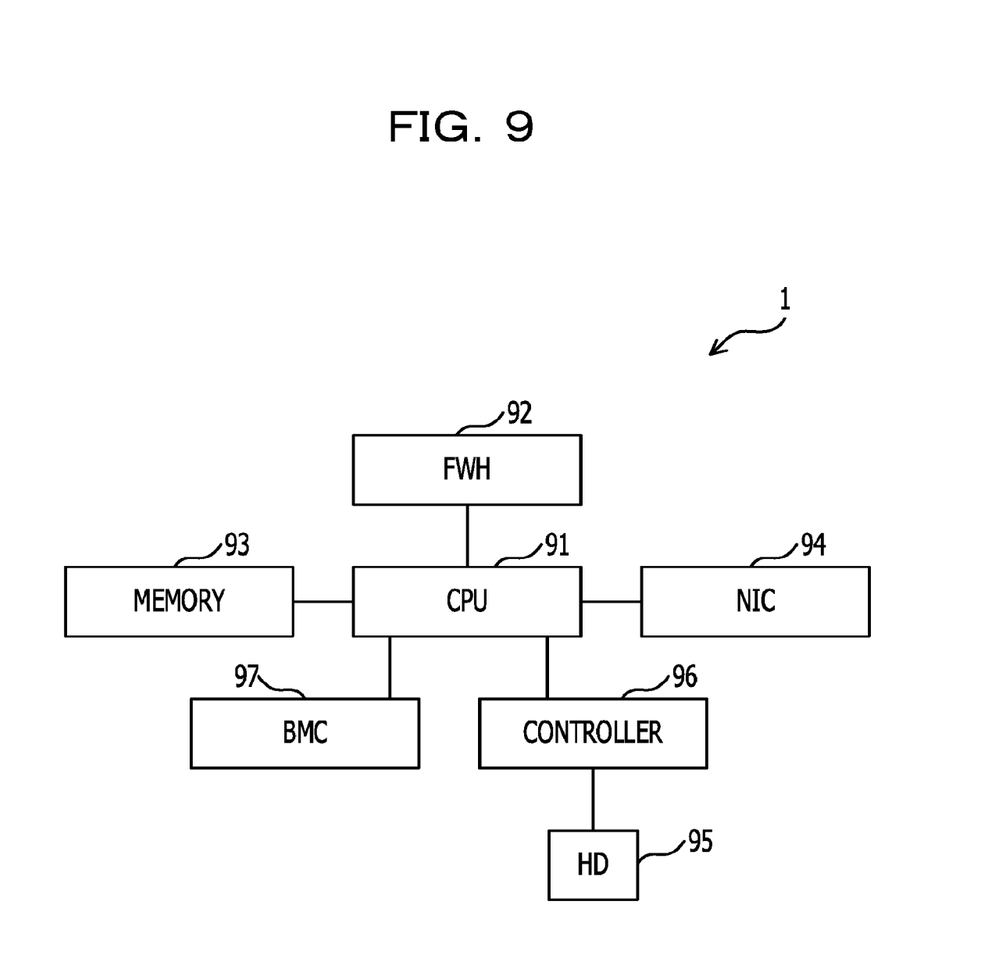
FIG. 9 illustrates an example of an image processing apparatus.

FIG. 9 illustrates an example of an information processing apparatus. The information processing apparatus illustrated in FIG. 9 may be the design support apparatus 1 illustrated in FIG. 1.

The information processing apparatus illustrated in FIG. 9 includes a central processing unit (CPU) 91, a firmware hub (FWH) 92, a memory (memory module) 93, a network interface card (NIC) 94, a hard disk (HD) 95, a controller 96, and a baseboard management controller (BMC) 97. The information processing apparatus illustrated in FIG. 9 may be one example of an information processing apparatus used as a server or the like.

The FWH 92 is a memory that stores firmware. The firmware is read into the memory 93 and executed by the CPU 91. The hard disk 95 stores an operating system (OS) and various application programs including an application program for executing processing in the design support apparatus 1. The CPU 91 may read the OS and any application program from the hard disk 95 through the controller 96 and execute them after completion of activation of the firmware. Communications through the NIC 94 are enabled by activation of the OS. The application program for executing the processing in the design support apparatus 1 may be referred to as "design support program."

The design support program may also be stored in a storage other than the hard disk 95 or a recording medium. Each of the storage or recording medium may be the one that can be accessed by an external device with which the NIC 94 can communicate over a network. The design support program may be received from the external device.

The BMC 97 may be a management device dedicated to manage the information processing apparatus. The BMC 97 may switch on and off the CPU 91, monitor errors occurring in each component, and the like.

The functions of the input and output unit 11, the via addition target area searching unit 12, and the SG via adding unit 13 may be implemented by the CPU 91 executing the above-described design support program on the OS.

The NIC 94 may be used in receiving the CAD data 2, the setting data 3, and various instructions and may further be used in outputting CAD data 2a. One of the memory 93 and the hard disk 95 may be used in storing the CAD data 2 and 2a and the setting data 3. The CPU 91 reads the data stored in the hard disk 95 into the memory 93 and performs processing. One or more programs for the processing may be stored in the FWH 92 and the hard disk 95. The functions of the input and output unit 11 may be implemented by, for example, the CPU 91, the FWH 92, the memory 93, the NIC 94, the hard disk 95, and the controller 96. The functions of the via addition target area searching unit 12 and the SG via adding unit 13 are implemented by, for example, the CPU 91, the FWH 92, the memory 93, the hard disk 95, and the controller 96.

To reduce processing for setting the path of travel of the search point, the search point is moved along a grid set as the wiring resource at the time of designing the printed circuit board. For example, the travel path may also be set independently of the grid. The path from the origin in the radial direction may be rectangular or may also be circular. When the grid set as the wiring resource is used, the grid number corresponding to travel of the search point at a time (interval of travel at a time) may be determined in consideration of the defensive area length, the grid interval, or the like.

The origin in the radial direction may be moved in a direction away from the starting point 32. The origin in the radial direction may be moved in the opposite direction or may also be moved in a discontinuous shape, for example, such that its travel path is discontinuous. If the origin is moved in a discontinuous shape, a path from the origin in the radial direction may be a path in which the origin is an end point.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A via adding method comprising:
   identifying a target area where a via is to be added in a printed circuit board;
   determining a starting point for starting a search for a location of the via in the target area;
   moving a search point along a path in an intersecting direction that intersects a radial direction around the starting point while moving the search point in the radial direction;
   determining whether a moved search point position is outside a defensive area for the starting point or another search point; and
   adding the via at the moved search point when the moved search point position is outside the defensive area,
   wherein the defensive area is set based on a wavelength of a signal which is input to or output from the printed circuit board.

2. The via adding method according to claim 1, further comprising,
   moving the search point in a direction away from the starting point in the radial direction.

3. The via adding method according to claim 1, further comprising,
   moving the search point in a spiral.

4. The via adding method according to claim 1, further comprising,
   determining a barycenter of the target area as the starting point.

5. The via adding method according to claim 1, wherein the target area is an area considered to be unaffected by another via which is placed along a border of an entire area in the printed circuit board.

6. The via adding method according to claim 1, further comprising,
   moving the search point along a grid set on the printed circuit board.

* * * * *